United States Patent

Fujimoto et al.

[11] Patent Number: 5,953,433
[45] Date of Patent: Sep. 14, 1999

[54] SURFACE ACOUSTIC WAVE DEVICE

[75] Inventors: Koji Fujimoto, Otsu; Michio Kadota, Kyoto; Toshimaro Yoneda, Nagaokakyo, all of Japan

[73] Assignee: Murata Manufacturing Co., Ltd., Kyoto, Japan

[21] Appl. No.: 09/038,716

[22] Filed: Jan. 28, 1998

[30] Foreign Application Priority Data

Feb. 20, 1997 [JP] Japan ................................. 9-036001

[51] Int. Cl.⁶ ............................... H04R 1/02; H04R 1/20
[52] U.S. Cl. ......................... 381/337; 381/160; 381/190; 310/313 R; 310/360
[58] Field of Search ..................................... 381/369, 170, 381/171, 173, 174, 190, 191, 113, 114; 310/313 A, 324, 322, 360; 333/193, 150, 154

[56] References Cited

U.S. PATENT DOCUMENTS

| 4,224,548 | 9/1980 | O'Connell | 310/360 |
| 4,224,549 | 9/1980 | O'Connell | 310/360 |
| 4,232,240 | 11/1980 | O'Connell | 310/330 |
| 4,515,667 | 5/1985 | Bartoszek-Loza | 204/162 |
| 5,684,884 | 11/1997 | Nakaya et al. | 381/190 |
| 5,764,782 | 6/1998 | Hayes | 381/160 |
| 5,847,486 | 12/1998 | Kadota et al. | 310/313 R |

FOREIGN PATENT DOCUMENTS

61-45892  10/1986  Japan .

*Primary Examiner*—Curtis A. Kuntz
*Assistant Examiner*—Rexford Barnie
*Attorney, Agent, or Firm*—Graham & James LLP

[57] ABSTRACT

A surface acoustic wave device includes a quartz rotated Y-cut plate and at least one interdigital transducer disposed on the quartz rotated Y-cut plate. The quartz rotated Y-cut plate has a Euler angle represented by $(0, \theta, \phi)$. The angle $\theta$ is within a range of about $125° < \theta < 130°$ or equivalents thereto, and the angle $\phi$ is approximately 90 degrees. The interdigital transducer is made of tungsten.

8 Claims, 7 Drawing Sheets

SURFACE ACOUSTIC WAVE DEVICE

BACKGROUND OF THE INVENTION

1. Field of the Invention

The present invention generally relates to a surface acoustic wave device for a resonator and a band-pass, or other similar electronic components, for example, and more particularly to a surface acoustic wave device having superior stable temperature characteristics.

2. Description of the Related Art

Surface acoustic wave devices are widely used as band-pass filters or resonators. Such surface acoustic wave devices are required to include a piezoelectric substrate having a large electromechanical coupling coefficient. Also required for some applications is a surface acoustic wave device having increased resistance against possible temperature variations.

Conventionally, an ST-cut quartz substrate, an LST-cut quartz substrate and the like are well known for use as such a piezoelectric substrate having superior stable temperature characteristics.

Japanese Patent Publication (Kokoku) No. 61-45892 discloses a surface acoustic wave device which has improved temperature characteristics by disposing on a rotated Y-cut quartz substrate an interdigital electrode made of Au in such a way that the X-axis of the substrate and the surface acoustic wave propagating direction define an angle of about 90 degrees therebetween.

However, the conventional ST-cut quartz substrate and LST-cut quartz substrates suffer from a problem of an insufficient electromechanical coupling coefficient, although these devices may provide good temperature characteristics.

The prior art surface acoustic wave device as disclosed in Japanese Patent Publication No. 61-45892 experiences an additional problem of increased costs due to the fact that its interdigital transducer is made of Au. Further, another problem associated with the prior art is that the manufacturing process is complicated due to the necessity of using an undercoat layer such as Cr or the like because Au has less adhesion strength for adhering to the substrate used.

For the aforementioned reasons, the inventors discovered that there is a need for a surface acoustic wave device having superior stable temperature characteristics and a large electromechanical coupling coefficient and which is adapted to be produced at a low cost.

SUMMARY OF THE INVENTION

The preferred embodiments of the present invention overcome the problems discussed above by providing a surface acoustic wave device having superior stable temperature characteristics and a large electromechanical coupling coefficient and which is adapted to be produced at a low cost. A surface acoustic wave device according to a preferred embodiment of the present invention comprises a quartz rotated Y-cut plate and at least one interdigital transducer made of tungsten and disposed on the quartz rotated Y-cut plate. The quartz rotated Y-cut plate has a Euler angle represented by $(0, \theta, \phi)$, where the angle $\theta$ is within a range of about $125° < \theta < 130°$ or equivalents thereto, and the angle $\phi$ is approximately 90 degrees.

The interdigital transducer preferably has a normalized film thickness $h/\lambda$ which is within a range of about $0.0075 < h/\lambda \leq 50.027$, where h is a film thickness of the interdigital transducer, and $\lambda$ is a wavelength of a surface acoustic wave to be excited on the quartz rotated Y-cut plate.

Further, the angle $\theta$ and the normalized film thickness $h/\lambda$ preferably satisfy the following equation:

$$\theta = 122.15 + 376.93 \times (h/\lambda) + 978.89 \times (h/\lambda)^2 \pm 0.5$$

According to the another aspect of the preferred embodiments of the present invention, a surface acoustic wave device comprises a quartz rotated Y-cut plate and at least one interdigital transducer made of tantalum and disposed on the quartz rotated Y-cut plate. The quartz rotated Y-cut plate has a Euler angle represented by $(0, \theta, \phi)$, where the angle $\theta$ is within a range of about $125° < \theta < 132°$ or equivalents thereto, and the angle $\phi$ is approximately 90 degrees.

The interdigital transducer preferably has a normalized film thickness $h/\lambda$ which is within a range of about $0.006 < h/\lambda \leq 0.031$, where h is a film thickness of the interdigital transducer, and $\lambda$ is a wavelength of a surface acoustic wave to be excited on the quartz rotated Y-cut plate. The angle $\theta$ and the normalized film thickness $h/\lambda$ preferably satisfy the following equation:

$$\theta = 122.4917 + 2921.45 \times (h/\lambda)$$

According to the preferred embodiments, it is possible to obtain a surface acoustic wave device having superior stable temperature characteristics at a low cost since tungsten or tantalum which is relatively inexpensive is used as a material for an interdigital transducer. Further, since the normalized film thickness of the interdigital transducer is set to be within the specific desired range, it is possible to provide a surface acoustic wave device having an increased electromechanical coupling coefficient while also having the significantly improved temperature characteristics.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1A:
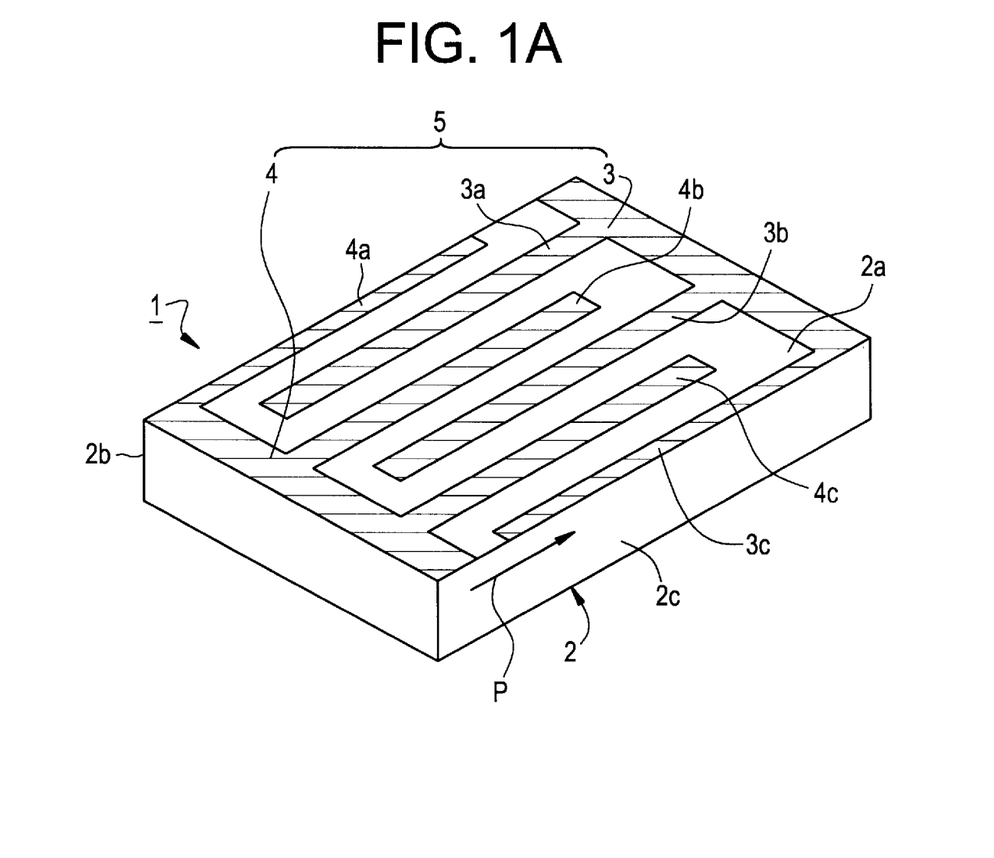
FIG. 1A is a perspective view of a surface acoustic wave device 1 in accordance with one preferred embodiment of the present invention.
Figure 1B:
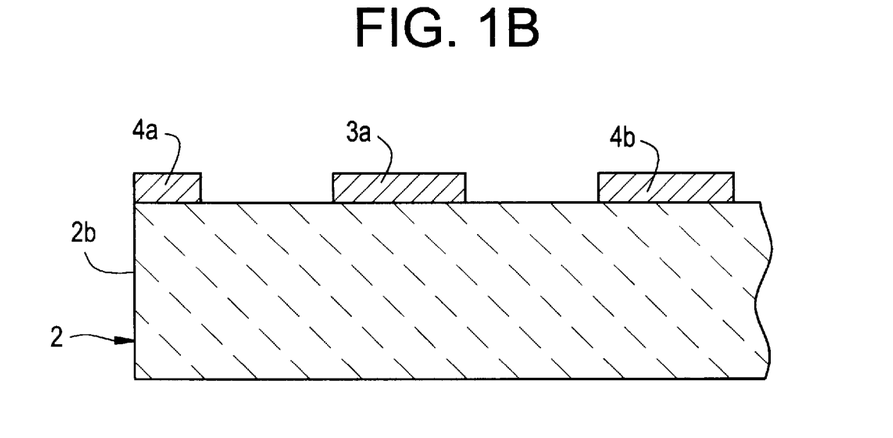
FIG. 1B is a cross-sectional view of the surface acoustic wave device shown in FIG. 1A.

FIGS. 1A is a perspective view of a surface acoustic wave device 1 in accordance with one preferred embodiment of the present invention, and FIG. 1B is a cross-sectional view of the surface acoustic wave device shown in FIG. 1A.

The surface acoustic wave device 1 is a surface acoustic wave resonator of the substrate edge reflection type which utilizes shear horizontal (SH) type surface waves such as Love waves. Note that the term "SH type surface wave" as used herein is intended to broadly include those surface acoustic waves having, as main components, displacement that is substantially perpendicular to the surface acoustic wave propagating direction and yet substantially parallel with the substrate surface. By way of example, leaky surface acoustic waves, BGS (Bleustein-Gulyaev-Shimizu) waves, Love waves and any equivalents thereof may be included.

The surface acoustic wave device 1 comprises a quartz rotated Y-cut plate 2 or with a Euler angle represented by (0, θ, ø) and an interdigital transducer 5 disposed thereon.

The interdigital transducer 5 includes a pair of comb-shaped electrodes 3 and 4 having a plurality of electrode fingers 3a–3c and 4a–4c, respectively. Electrode fingers 3a–3c and electrode fingers 4a–4c extend in a first direction P and the fingers are interdigitated with each other.

A surface acoustic wave excited on the surface 2a of the quartz rotated Y-cut plate 2 propagates in a direction that is substantially perpendicular to the first direction P. That is, the angle ø which is defined by the angle between the X axis of the quartz rotated Y-cut plate 2 and the direction in which surface acoustic waves excited on the quartz rotated Y-cut plate 2 propagate is about 90 degrees. The electrode fingers 4a and 3c are arranged to be flush with the opposing substrate edges 2b and 2c of the quartz rotated Y-cut plate 2. The electrode fingers 4a and 3c preferably have a width of about λ/8, where λ denotes a wavelength of the surface acoustic wave excited on the quartz rotated Y-cut plate 2. The electrode fingers 3a, 3b, 4b and 4c preferably have a width of about λ/4, and a space between adjacent ones of the electrode fingers is also about λ/4.

In the surface acoustic wave device 1, the excited surface acoustic wave is reflected by the opposing substrate edges 2b and 2c, thereby generating a standing wave on the quartz rotated Y-cut plate 2 and resonating at a predetermined frequency.

One significant feature of the surface wave device 1 in accordance with this preferred embodiment is that the interdigital transducer 5 is made of tungsten and that the angle θ of the quartz rotated Y-cut plate 2 having a Euler angle represented by (0, θ, ø) is set to be in a range of about 125°<θ<130°, thereby achieving superior stable temperature characteristics in the surface acoustic wave device 1. This will be explained with reference to FIG. 2 to FIG. 4.

Figure 2:
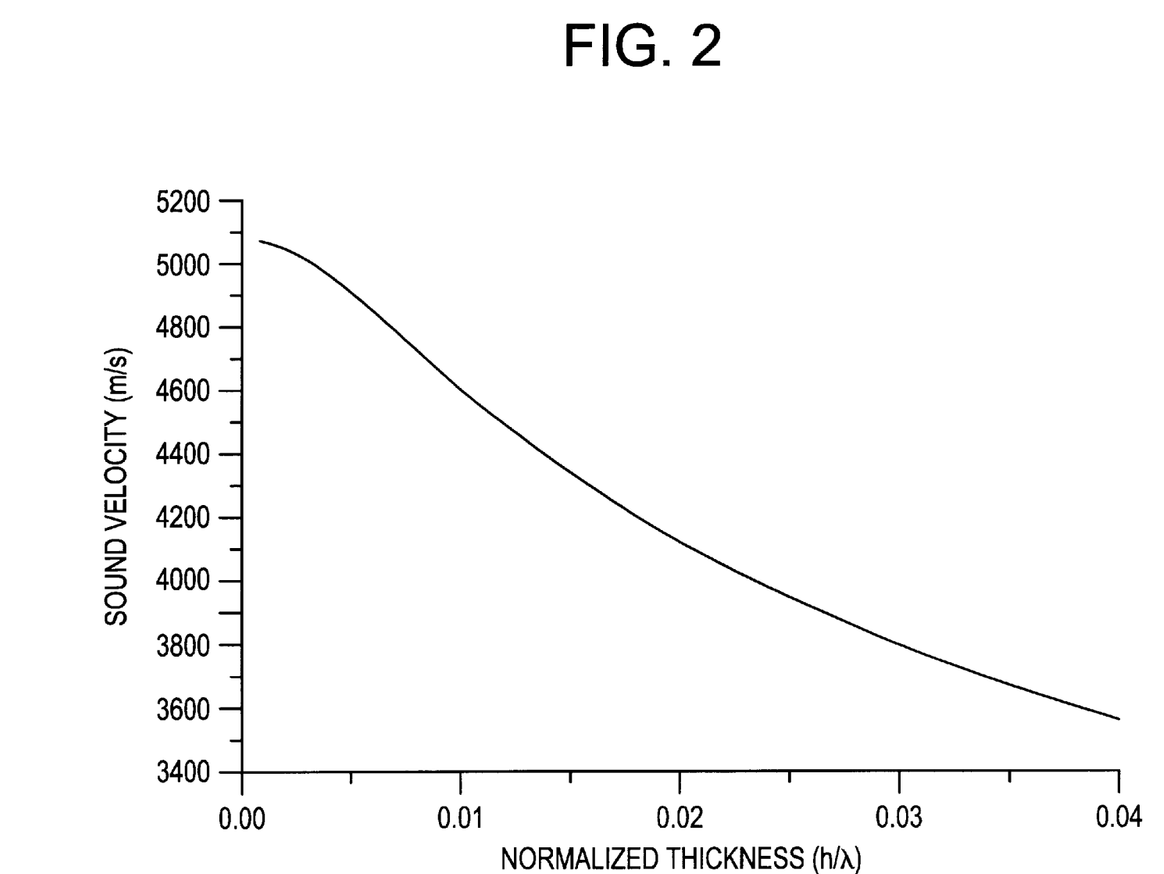
FIG. 2 is a graph showing the relationship between the normalized film thickness $h/\lambda$ of tungsten and the phase velocity of the surface acoustic wave generated on a quartz rotated Y-cut plate having a Euler angle of $(0, 127°, 90°)$.

FIG. 2 is a graph showing results of experimentation for analyzing by finite element methods the sound velocity of a surface acoustic wave of the quartz rotated Y-cut plate 2 having a Euler angle of about (0, 127, 90) as used in an example of this preferred embodiment. The result of FIG. 2 is an analysis result as obtained by forming a tungsten thin-film to have various film thickness values on the quartz rotated Y-cut plate and then performing analysis using the finite element method in consideration of an elastic constant, a piezoelectric constant, a dielectric constant, a density and a linear expansion coefficient of quartz and an elastic constant, a density, a linear expansion coefficient and a film thickness of tungsten. The film thickness of tungsten is normalized by dividing the film thickness of tungsten by a wavelength of the surface acoustic wave excited on the quartz rotated Y-cut plate.

As apparent from FIG. 2, it may be seen that the phase velocity of the surface acoustic wave decreases as the normalized film thickness h/λ of tungsten increases.

Figure 3:
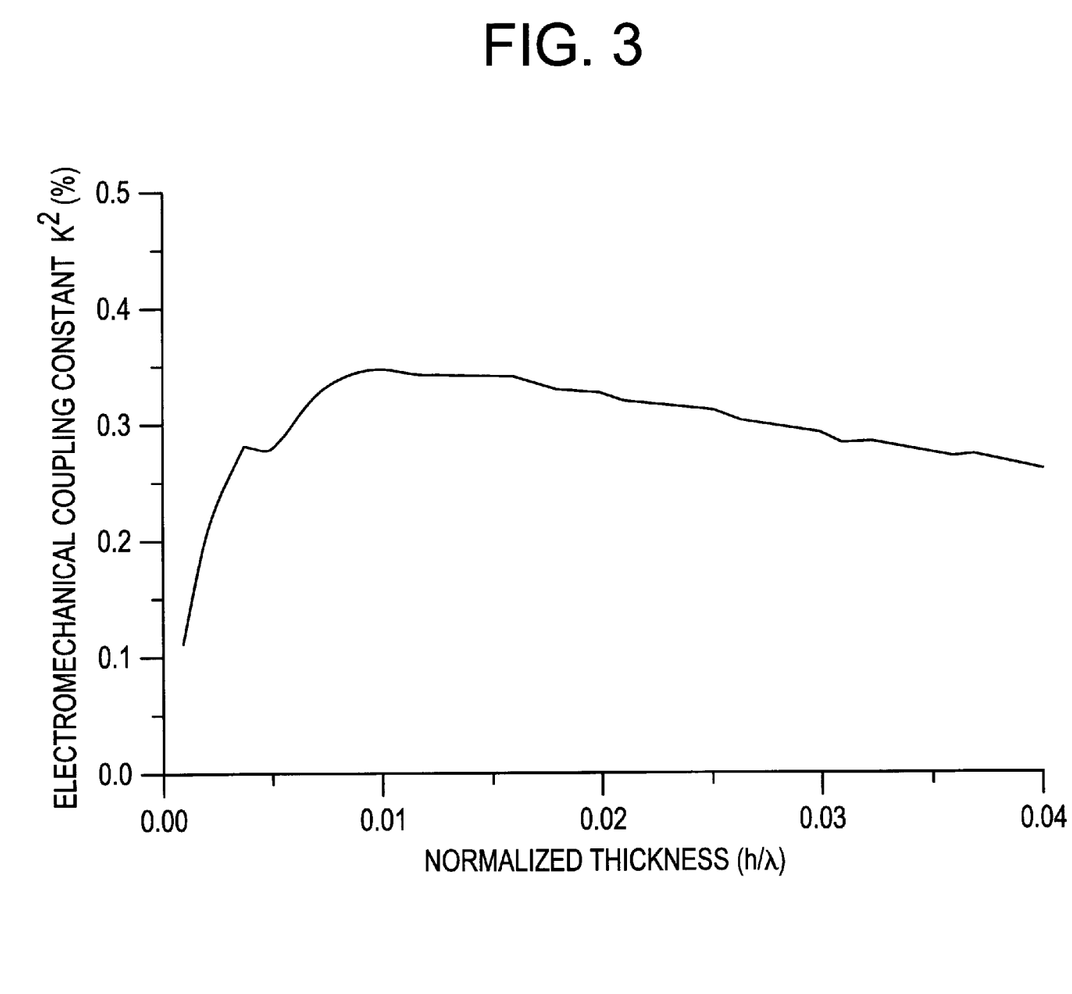
FIG. 3 is a graph showing the relationship between the normalized film thickness $h/\lambda$ and the electromechanical coupling coefficient $k^2$ in a structure including a tungsten thin-film disposed on the quartz rotated Y-cut plate having a Euler angle of $(0, 127°, 90°)$.

FIG. 3 is a graph showing a relationship between the normalized film thickness of the tungsten thin-film and the electromechanical coupling coefficient $k^2$ (%) obtained based on the phase velocity shown in FIG. 2. Note that the electromechanical coupling coefficient $k^2$ in FIG. 3 is a value as calculated using the following Equation (3):

$$k^2 = 2 \times (V_0 - V_S)/V_0 \tag{1}$$

where $V_0$ is the phase velocity of a surface acoustic wave under the assumption that the dielectric constant of tungsten is 1 and $V_S$ is the sound velocity of surface wave under the assumption that the dielectric constant of tungsten is zero.

As is apparent from FIG. 3, the electromechanical coupling coefficient $k^2$ becomes 0.3% or greater in a range in which the normalized film thickness h/λ of tungsten is greater than about 0.0075 and equal to or less than about 0.027. Accordingly, it can be understood that the surface acoustic wave device having an increased electromechanical coupling coefficient $k^2$ is attainable by setting the normalized film thickness h/λ of the interdigital transducer made of tungsten at a value greater than about 0.0075 and equal to or less than about 0.027.

Figure 4:
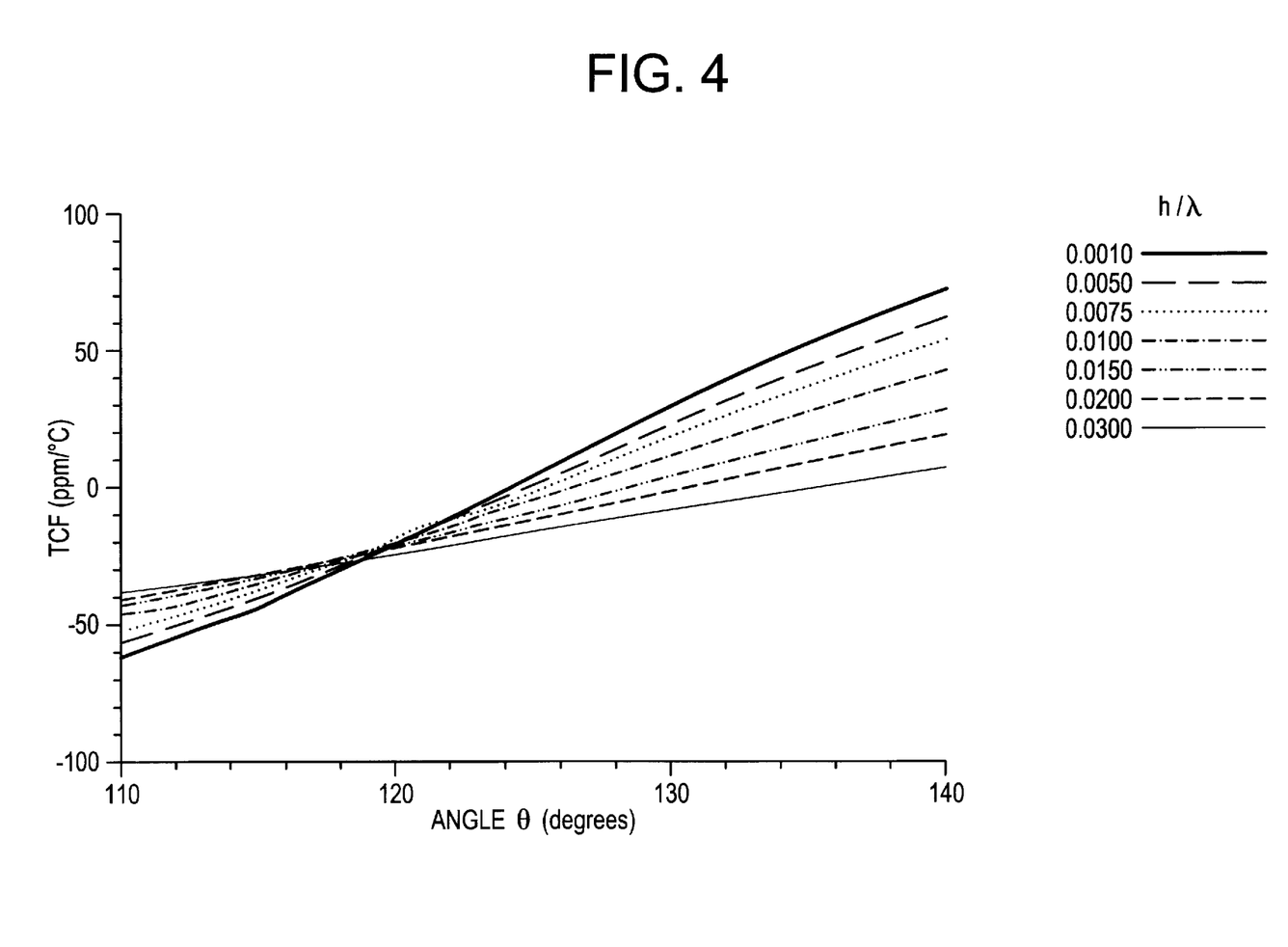
FIG. 4 is a graph showing the relationship between the temperature coefficient of the resonance frequency and the angle $\theta$ in a structure having a tungsten thin-film disposed on a quartz rotated Y-cut plate having a Euler angle of $(0, \theta, 90°)$.

FIG. 4 shows that a relationship between a temperature coefficient of resonance frequency (TCF) and the angle θ of the quartz rotated Y-cut plate 2 having a Euler angle (0, θ, ø) at various normalized thicknesses h/λ. The TCF is measured between −20° C. and 80° C., and the angle ø is set to be 90 degrees.

In FIG. 4, certain results are shown for respective cases where the normalized film thickness h/λ of tungsten is set at the approximate values of 0.0010, 0.0050, 0.0075, 0.100, 0.0150, 0.0200 and 0.0300.

As is apparent from FIG. 4, when the angle θ is selected so as to satisfy the inequalities 125°<θ<130° or equivalents thereof, the TCF can be about zero in the range of about 0.0075<h/λ<0.027. Therefore, in the case where a quartz rotated Y-cut plate having a Euler angle (0, θ, 90) is used, it is possible by setting the angle θ in the range of from about 125 degrees to about 130 degrees to achieve a surface wave device having superior stable temperature characteristics.

It is also understood from the results of FIGS. 3 and 4 that it becomes possible, by designing the relation of angle θ and h/λ so as to satisfy the following Equation (2), to provide a surface wave device having an excellent TCF and the electromechanical coupling coefficient equal to about 0.3% or greater.

$$\theta = 122.15 + 376.93 \times (h/\lambda) + 978.89 \times (h/\lambda)^2 \pm 0.5 \tag{2}$$

According to the further study by the inventors, it has been confirmed that it is also possible to provide similar surface acoustic wave devices having superior stable temperature characteristic as long as the angle ø is within the range of about 90°±10°.

A surface acoustic wave device according to a second preferred embodiment of the present invention preferably has the same structure as that of the surface acoustic wave device according to the first preferred embodiment except that the interdigital transducer 5 is made of tantalum. Accordingly, an explanation of the structure of the surface wave device of the second preferred embodiment will not be repeated here, but the explanation as to the surface wave device shown in FIGS. 1(a) and (b) is incorporated herein.

One significant feature of the surface wave device 1 in accordance with this second preferred embodiment is that the interdigital transducer 5 is made of tantalum and that the angle θ of the quartz rotated Y-cut plate 2 having a Euler angle represented by (0, θ, ø) is preferably set to be in a range of about 125°<θ<132°, thereby providing superior stable temperature characteristics in the surface acoustic wave device 1. This will be explained with reference to FIG. 5 to FIG. 7.

Figure 5:
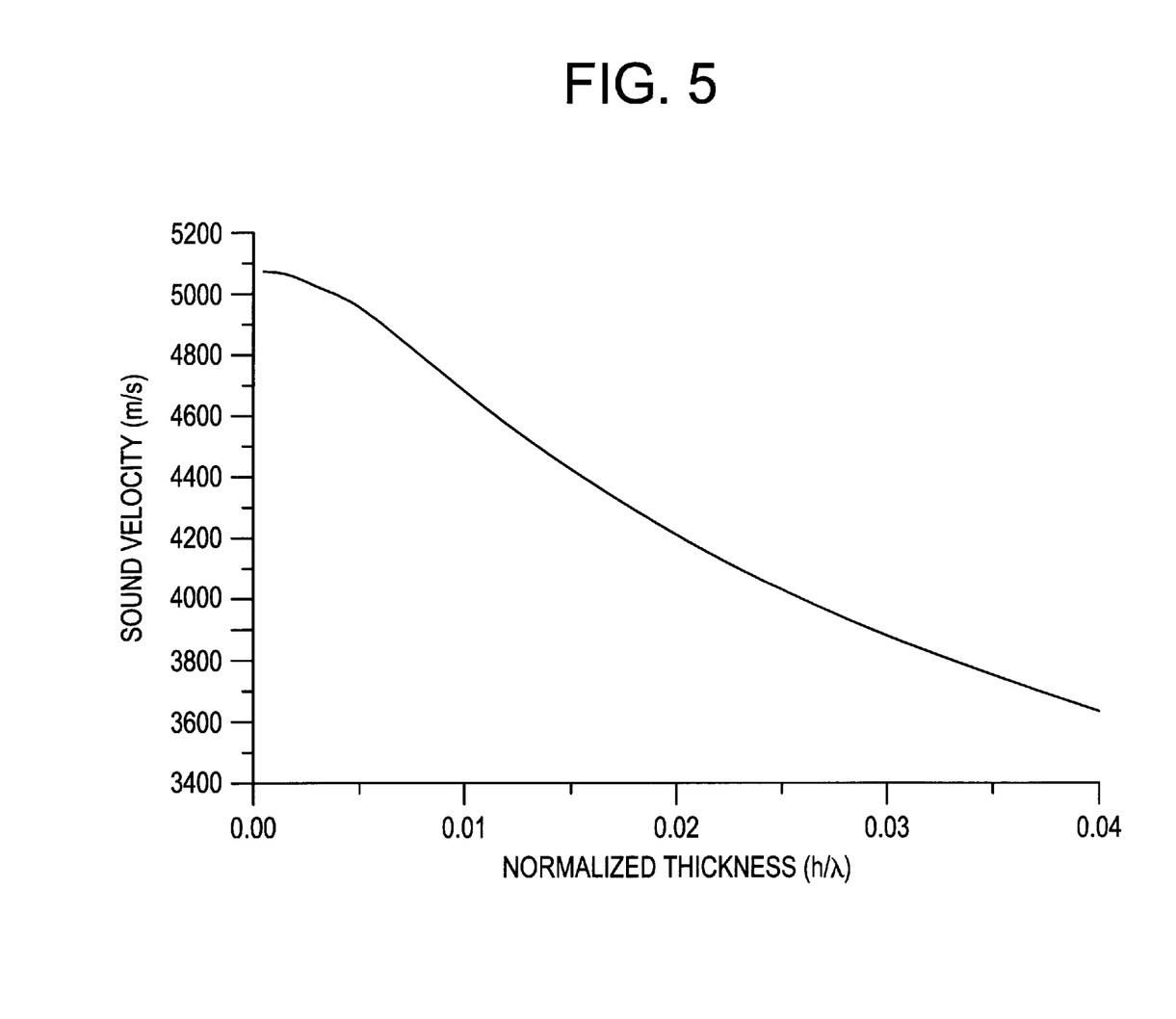
FIG. 5 is a graph showing the relationship between the normalized film thickness $h/\lambda$ of tantalum and the phase velocity of the surface acoustic wave on a quartz rotated Y-cut plate having a Euler angle of $(0, 127°, 90°)$.

FIG. 5 is a graph showing a result of experimentation for analyzing by finite element methods the sound velocity of a surface acoustic wave of the quartz rotated Y-cut plate 2 having a Euler angle of (0, 127, 90) as used in this preferred embodiment. The result of FIG. 5 is an analysis result as obtained by forming a tantalum thin-film to have various film thickness values on the quartz rotated Y-cut plate and then performing analysis using the finite element method in consideration of an elastic constant, a piezoelectric constant, a dielectric constant, a density and a linear expansion coefficient of quartz and an elastic constant, a density, a linear expansion coefficient and a film thickness of tantalum. The film thickness of tantalum is normalized by dividing the film thickness of tantalum by a wavelength of the surface acoustic wave excited on the quartz rotated Y-cut plate.

As apparent from FIG. 5, it may be seen that the phase velocity of surface acoustic wave decreases as the normalized film thickness h/λ of tantalum increases.

Figure 6:
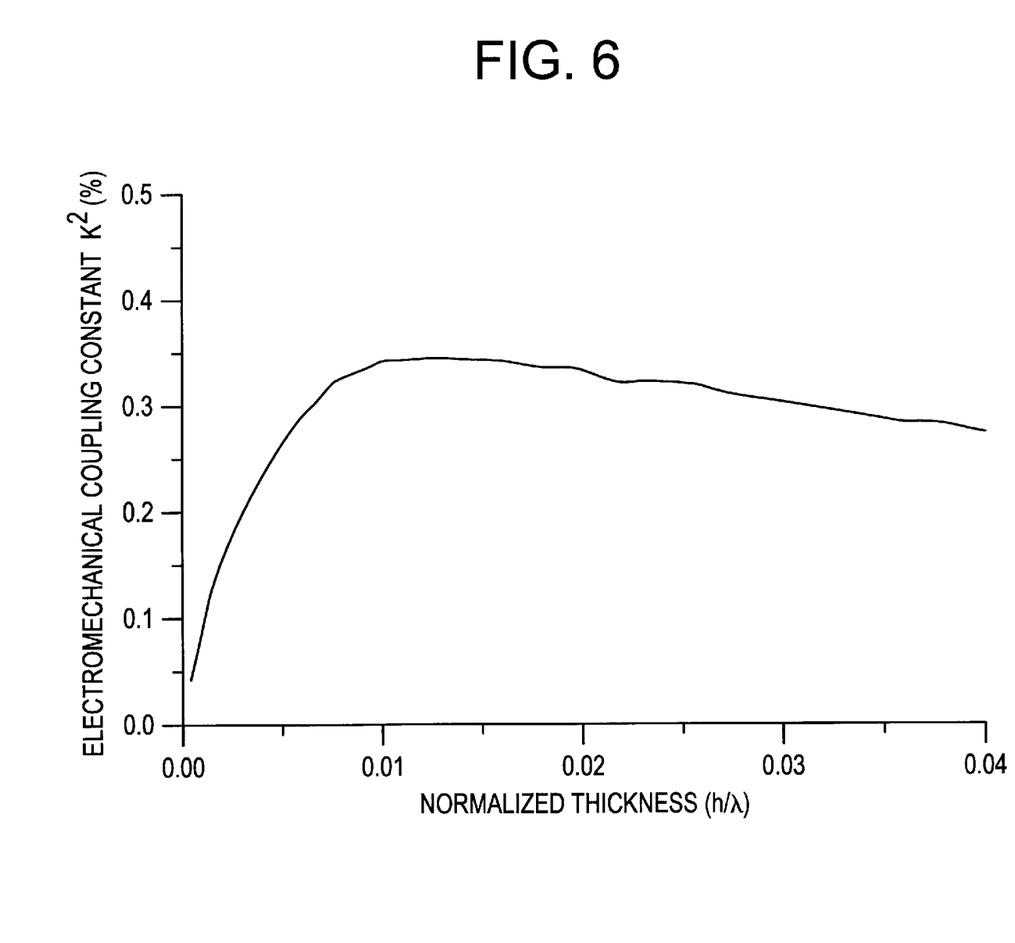
FIG. 6 is a graph showing the relationship between the normalized film thickness $h/\lambda$ and the electromechanical coupling coefficient $k^2$ in a structure including a tantalum thin-film disposed on the quartz rotated Y-cut plate having a Euler angle of $(0, 127°, 90°)$.

FIG. 6 is a graph showing a relationship between the normalized film thickness of the tantalum thin-film and the electromechanical coupling coefficient $k^2$ (%) obtained based on the sound velocity shown in FIG. 5. Note that the electromechanical coupling coefficient $k^2$ in FIG. 6 is a value as calculated using the following Equation (3):

$$k^2 = 2 \times (V_0 - V_S)/V_0 \qquad (3)$$

where $V_0$ is the phase velocity of a surface acoustic wave under the assumption that the dielectric constant of tantalum is 1 and $V_S$ is the phase velocity of surface wave under the assumption that the dielectric constant of tantalum is zero.

As is apparent from FIG. 6, the electromechanical coupling coefficient $k^2$ becomes about 0.3% or greater in a range in which the normalized film thickness h/λ of tantalum is greater than about 0.006 and equal to or less than about 0.031. Accordingly, it can be understood that the surface acoustic wave device having an increased electromechanical coupling coefficient $k^2$ is achieved by setting the normalized film thickness h/λ of the interdigital transducer made of tantalum at a value greater than about 0.006 and equal to or less than about 0.031.

Figure 7:
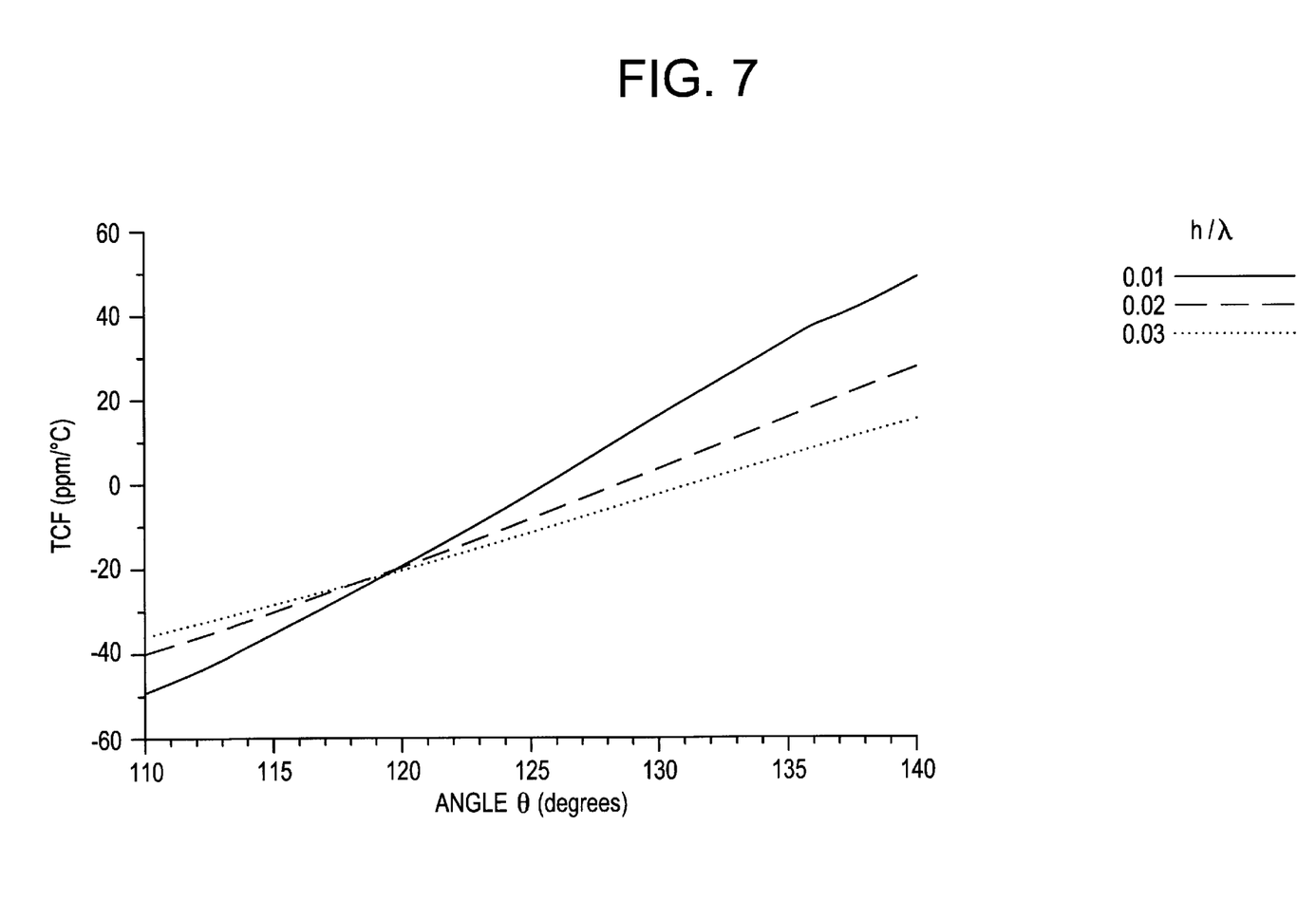
FIG. 7 is a graph showing the relationship between the temperature coefficient of resonance frequency and the angle θ in a structure having a tantalum thin-film disposed on a quartz rotated Y-cut plate having a Euler angle of (0, θ, 90°).

FIG. 7 shows that a relationship between a temperature coefficient of resonance frequency (TCF) and the angle θ of the quartz rotated Y-cut plate 2 having a Euler angle (0, θ, ø) set at various normalized thicknesses h/λ. The TCF is measured between −20° C. and 80° C., and the angle θ is set to be 90 degrees.

In FIG. 7, certain results are shown for respective cases where the normalized film thickness h/λ of tantalum is set at the approximate values of 0.0100, 0.0200 and 0.0300.

As is apparent from FIG. 7, when the angle θ is selected so as to satisfy the inequalities 125°<θ<132° and equivalents thereof, the TCF can be about zero in the range of about 0.006<h/λ<0.031. Therefore, in the case where a quartz rotated Y-cut plate having a Euler angle (0, θ, 90) is used, it is possible by setting θ in the range of from about 125 degrees to about 132 degrees to achieve a surface acoustic wave device having superior stable temperature characteristics.

It is also understood from the results of FIGS. 6 and 7 that it becomes possible, by designing the relationship between angle θ and h/λ so as to satisfy the following Equation (4), to provide a surface wave device having an excellent TCF and the electromechanical coupling coefficient equal to about 0.3% or greater.

$$\theta = 122.4971 + 2921.45 \times (h/\lambda) \qquad (4)$$

According to the further study by the inventors, it has been confirmed that it is possible to provide similar surface acoustic wave devices having superior stable temperature characteristic as long as the angle ø is within the range of about 90°+10°.

Although in the first and second preferred embodiments, the preferable ranges of the angle θ and the angle ø are explained in detail, it should be noted that other ranges of the angle θ and the angle ø which are equivalent to the ranges which are specified in the above description of the first and second preferred embodiments and that such equivalent ranges are also within the scope of the present invention.

Moreover, although in the first and second preferred embodiments some examples are indicated with regard to the surface wave resonators of the substrate edge reflection type, surface acoustic wave devices according to the invention should not limited to such substrate edge reflection type surface wave devices only, and may alternatively be applicable to those surface wave resonators of the reflector type. In addition, the interdigital transducer 5 may be made of substantially only tungsten or tantalum or made of an alloy mainly consisting of tungsten or tantalum. The interdigital transducer 5 may have a multilayer structure including at least one tungsten or tantalum layer and a layer made of another material such as aluminum.

It should further be pointed out that the invention may also be applicable to surface acoustic wave filters and surface acoustic wave delay lines other than the surface acoustic wave resonators.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
    a quartz rotated Y-cut plate having a Euler angle represented by (0, θ, ø), the angle θ being within a range of about 125°<θ<130°, and the angle ø being approximately 90 degrees; and
    at least one interdigital transducer disposed on the quartz rotated Y-cut plate, the interdigital transducer including tungsten.

2. The surface acoustic wave device according to claim 1, wherein the interdigital transducer has a normalized film thickness h/λ which is within a range of about 0.0075<h/λ≦0.027, where h is a film thickness of the interdigital transducer, and λ is a wavelength of a surface acoustic wave excited on the quartz rotated Y-cut plate.

3. The surface acoustic wave device according to claim 2, wherein the angle θ and the normalized film thickness h/λ satisfy the following equation:

$$\theta = 122.15 + 376.93 \times (h/\lambda) + 978.89 \times (h/\lambda)^2 \pm 0.5$$

4. The surface acoustic wave device according to claim 1, wherein the device is a surface acoustic wave device of a substrate edge reflection type which makes use of an SH type surface wave.

5. A surface acoustic wave device comprising:

a quartz rotated Y-cut plate having a Euler angle represented by (0, θ, ø), the angle θ being within a range of about 125°<θ<132°, and the angle ø being approximately 90 degrees; and at least one interdigital transducer disposed on the quartz rotated Y-cut plate, the interdigital transducer including tantalum.

6. The surface acoustic wave device according to claim 5, wherein the interdigital transducer has a normalized film thickness h/λ which is within a range of about 0.006<h/λ≦0.031, where h is a film thickness of the interdigital transducer, and λ is a wavelength of a surface acoustic wave excited on the quartz rotated Y-cut plate.

7. The surface acoustic wave device according to claim 6, wherein the angle θ and the normalized film thickness h/λ satisfy the following equation:

$$\theta = 122.4917 + 2921.45 \times (h/\lambda)$$

8. The surface acoustic wave device according to claim 5, wherein the device is a surface acoustic wave device of a substrate edge reflection type which makes use of an SH type surface wave.

* * * * *